(12) United States Patent
Yamasaki et al.

(10) Patent No.: US 6,913,996 B2
(45) Date of Patent: Jul. 5, 2005

(54) METHOD OF FORMING METAL WIRING AND SEMICONDUCTOR MANUFACTURING APPARATUS FOR FORMING METAL WIRING

(75) Inventors: Hideaki Yamasaki, Nirasaki (JP); Mitsuhiro Tachibana, Nirasaki (JP); Kazuya Okubo, Nirasaki (JP); Kenji Suzuki, Nirasaki (JP); Yumiko Kawano, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/181,273
(22) PCT Filed: Nov. 13, 2001
(86) PCT No.: PCT/JP01/09924
§ 371 (c)(1),
(2), (4) Date: Jul. 16, 2002
(87) PCT Pub. No.: WO02/41379
PCT Pub. Date: May 23, 2002

(65) Prior Publication Data
US 2003/0003729 A1 Jan. 2, 2003

(30) Foreign Application Priority Data
Nov. 17, 2000 (JP) .................................... 2000-351716

(51) Int. Cl.[7] ....................... H01L 21/4763; H01L 21/44
(52) U.S. Cl. ................... 438/648; 438/653; 438/656; 438/685
(58) Field of Search .................................. 438/648, 652, 438/653, 656, 685; 118/723

(56) References Cited

U.S. PATENT DOCUMENTS

| | | | | |
|---|---|---|---|---|
| 5,306,666 A | | 4/1994 | Izumi | 438/680 |
| 5,407,698 A | * | 4/1995 | Emesh | 427/99 |
| 6,048,788 A | * | 4/2000 | Huang et al. | 438/629 |
| 6,139,700 A | | 10/2000 | Kang et al. | 204/192.17 |
| 6,200,893 B1 | * | 3/2001 | Sneh | 438/685 |
| 6,277,744 B1 | * | 8/2001 | Yuan et al. | 438/685 |
| 6,309,966 B1 | * | 10/2001 | Govindarajan et al. | 438/656 |
| 6,551,929 B1 | * | 4/2003 | Kori et al. | 438/685 |

FOREIGN PATENT DOCUMENTS

| | | | | |
|---|---|---|---|---|
| EP | 1 100 116 | | 5/2001 | |
| JP | 07022414 | | 1/1995 | |
| JP | 07094727 | | 4/1995 | |
| JP | 11-307480 | | 11/1995 | |
| JP | 11054459 | | 2/1999 | |
| JP | 2001-168062 A | * | 6/2001 | H01L/21/285 |

* cited by examiner

*Primary Examiner*—T. N. Quach
(74) *Attorney, Agent, or Firm*—Pillsbury Winthrop Shaw Pittman LLP

(57) ABSTRACT

A metal film forming method, includes the steps of (a) (s13, s15) supplying a plural kinds of ingredient gases to a base barrier film (3) in sequence, wherein at least one of the gases includes a metal, and (b) (s14, s16) vacuum-exhausting the ingredient gases of the step (a) or substituting the ingredient gases of the step (a) by an other kind of gas after the ingredient gases of the step (a) are supplied respectively, thereby an extremely thin film (5) of the metal is formed on the base barrier film (3).

34 Claims, 7 Drawing Sheets

METHOD OF FORMING METAL WIRING AND SEMICONDUCTOR MANUFACTURING APPARATUS FOR FORMING METAL WIRING This is a National Stage application of International Application No. PCT/JP01/09924, which was filed on Nov. 13, 2001 and designated the U.S., and which was filed in the English language.

TECHNICAL FIELD

The present invention generally relates to methods of forming metal wiring and semiconductor manufacturing apparatuses for forming metal wiring, and more particularly, to a method of embedding metal wiring into a concave part formed in an object body of manufacturing processes of a semiconductor integrated circuit such as a semiconductor wafer and to a semiconductor manufacturing apparatus for such forming metal wiring.

BACKGROUND ART

Generally, various steps in a manufacturing process of a semiconductor integrated circuit, such as a forming a film step, an oxidation diffusion step, an etching step and others are repeated to be carried out on a surface of a semiconductor wafer which is an object body of the above-mentioned processes. A concave part such as a contact hole or through hole is formed during the manufacturing process of the semiconductor integrated circuit. There is a tendency that a metal tungsten film formed by a chemical vapor deposition method (CVD method) is mostly utilized to be embedded into the concave part. The metal tungsten film formed by the CVD method has a high covering ability, a robustness of the wire snapping, and a low specific resistance and is relatively easy to be formed.

It is general, as a method of forming a film of the metal tungsten, to supply a $WF_6$ (tungsten hexafluoride) gas as an ingredient gas including a tungsten and a $H_2$ (hydrogen) gas as a reduction gas, to reduce $WF_6$ by $H_2$ in a state of a temperature in a range between 400 and 450° C., and to form a film of the metal tungsten on a TiN (titanium nitride) film as a base film mainly.

The TiN film formed by a physical vapor deposition method (PVD method) or a CVD method is generally utilized as a base film because of the following reasons. Firstly, it is necessary to form a film of tungsten equally on a whole of a surface of the wafer. This is because metal tungsten formed by a $H_2$ reduction method has different rates of forming a film on between a metal surface and an insulator surface. Secondly, the base film is necessary as a barrier preventing $WF_6$ which is an ingredient of tungsten from encroaching a lower layer.

A conventional process of forming the metal tungsten will be described as follows.

During the process of forming a film of metal tungsten, if the film is attempted to be formed by the CVD method from the beginning of the process, it is hard to stick the film on the surface of the wafer and there is a tendency in that an incubation time becomes long. In order to prevent the above-described state, firstly a $WF_6$ gas as an ingredient gas, a $H_2$ gas as a reduction gas, a $SiH_4$ (monosilane) gas, and the like are flown a small amount each, so that a nucleus making layer of tungsten which is a crystal seed is grown on the surface of the wafer. Next, the large amount of the above-mentioned ingredient gas or the reduction gas is flown, thereby the tungsten film is grown at high growth rate on the nucleus making layer as a seed. Thus, the tungsten film having designated thickness can be achieved.

FIG. 1 is a graph showing a relation between a process time and a film thickness in the above-mentioned film forming process. Following the pre-process, a nucleus making layer forming step is carried out. At a first part of the nucleus making layer forming step starts, the film does not stick for a period of time, namely for an incubation time T1. Also, at a first part of the main tungsten film forming step starts following to the nucleus making layer forming step, a film does not stick for a period of time, namely for an incubation time T2. After the incubation time T2, the large amount of the tungsten film is formed.

Meanwhile, recently, it becomes more difficult to embed the metal film into a contact hole or a through hole such as a via-hole 2 as a result of that a semiconductor integrated circuit becomes minute and high integrated. As shown in FIG. 2, it is a main way to utilize a MOCVD-TiN (metal organic CVD-TiN) film 3, which is refined by a plasma step from a CVD film for which an organic Ti (titanium) source is utilized, as a base barrier film of the via-hole 2 used for particularly wiring in upper layers. It is not possible to obtain a sufficient covering ability of the base barrier film by the PVD method. A carbon is an impurity and stays inside of the film due to that an organic material is utilized as an ingredient of the CVD film. By the plasma step, it is possible to throw the carbon out after the film is formed, so that a purity and density of the film can be heighten.

The CVD-W film forming was carried out conventionally to the PVD-TiN film or the inorganic CVD-TiN film for which $TiCl_4$ is utilized. As shown in FIG. 3, a tungsten film having a high quality can be formed on the base barrier film by such the CVD-W film forming, because an upper plane surface and a base part of a hole are refined sufficiently by reaching plasma thereon. However, as a fundamental nature with regard to the plasma, it is difficult for the plasma to reach the side wall of the hole. Hence, refining by the plasma may not be sufficient and it may be difficult to form a film of the tungsten thereon. Thereby, even if the film of the tungsten is formed, the tungsten film may have a low quality and the tungsten film may not be embedded into the hole sufficiently.

DISCLOSURE OF INVENTION

Accordingly, it is a general object of the present invention is to provide a novel and useful method of forming metal wiring into a concave part formed in an object body of manufacturing processes of a semiconductor integrated circuit and semiconductor manufacturing apparatuses for forming metal wiring into a concave part formed in an object body of manufacturing processes of a semiconductor integrated circuit.

Another and more specific object of the present invention is to provide a method of forming metal wiring and a semiconductor manufacturing apparatus for forming metal wiring, in which it is possible to embed a tungsten into a hole satisfactorily even in case of that a base barrier film comprises a MO-TiN including an impurity.

Still another object of the present invention is to provide a metal film forming method, including the steps of (a) supplying a plural kinds of ingredient gases to a base barrier film in sequence, wherein at least one of the gases includes a metal, and (b) vacuum-exhausting the ingredient gases of the step (a) or substituting the ingredient gases of the step (a) by an other kind of gas at after the ingredient gases of the step (a) are supplied respectively, thereby an extremely thin film of the metal is formed on the base barrier film. The steps of (a) and (b) may be repeated.

The metal film forming method may further include the step of (c) forming a main film of the metal on the extremely thin film of the metal in a state where the extremely thin film of the metal is utilized as a nucleus making layer.

In the metal film forming method, a main film of the metal may be formed in a hole provided in a substrate and including the base barrier film, thereby a metal wiring part can be formed therein.

The metal may includes tungsten and the extremely thin film of the metal formed on the base barrier has a thickness in a range between 0.2 nm and 20.0 nm.

The base barrier film may be made of TiN comprising an organic titanium compound, the ingredient gas including the metal comprises a $WF_6$ gas, and the other ingredient gas comprises a $SiH_4$ gas. In this case, the $WF_6$ gas may be supplied with a conduction in a range between 5 Pa sec and 10 kPa sec.

The metal film forming method may further include the step of (d) supplying $SiH_4$ as a pre-process of forming the tungsten extremely thin film of the metal on the base barrier film. In this case, the $SiH_4$ may be supplied with a conduction in a range between 1 kPa sec and 25 kPa sec.

The main film of the metal may be formed in a hole provided in a substrate and including the base barrier film thereby a metal wiring part can be formed therein, and the substrate has a temperature in a range between 150° C. and 350° C. In this case, the main film of the metal may be formed in a hole provided in a substrate and including the base barrier film thereby a metal wiring part can be formed therein and the $SiH_4$ gas is supplied with a conduction in a range between 13 Pa sec and 10 kPa sec.

The main film of the metal may be formed in a hole provided in a substrate and including the base barrier film thereby a metal wiring part can be formed therein and the substrate has a temperature in a range between 355° C. and 500° C. In this case, the main film of the metal may be formed in a hole provided in a substrate and including the base barrier film thereby a metal wiring part can be formed therein and the $SiH_4$ gas is supplied with a conduction in a range between 40 Pa sec and 10 kPa sec.

According to the present invention, when a tungsten extremely thin film is formed on a base barrier film, plural kinds of ingredient gases for forming a tungsten are supplied plural times one kind each. Accordingly, it is possible to form the tungsten extremely thin film in a hole of a substrate under a satisfactory condition accurately. Therefore, the main tungsten film is formed accurately as embedded into an even minute hole accurately, because the main tungsten film is formed on the tungsten extremely thin film as a nucleus making layer.

A further object of the present invention is to provide a semiconductor manufacturing device for forming a metal wiring part embedded into a hole which is formed in a substrate and has a base barrier on an inside wall thereof, including means for supplying a plural kinds of ingredient gases to a base barrier film in sequence wherein at least one of the gases includes a metal, means for vacuum-exhausting the ingredient gases or substituting the ingredient gases by an other kind of gas after the ingredient gases are supplied respectively thereby extremely thin film of the metal is formed on the base barrier film, and means for forming a main film of the metal on the extremely thin film of the metal in a state where the extremely thin film of the metal is utilized as a nucleus making layer.

BEST MODE FOR CARRYING OUT THE INVENTION

Figure 1:
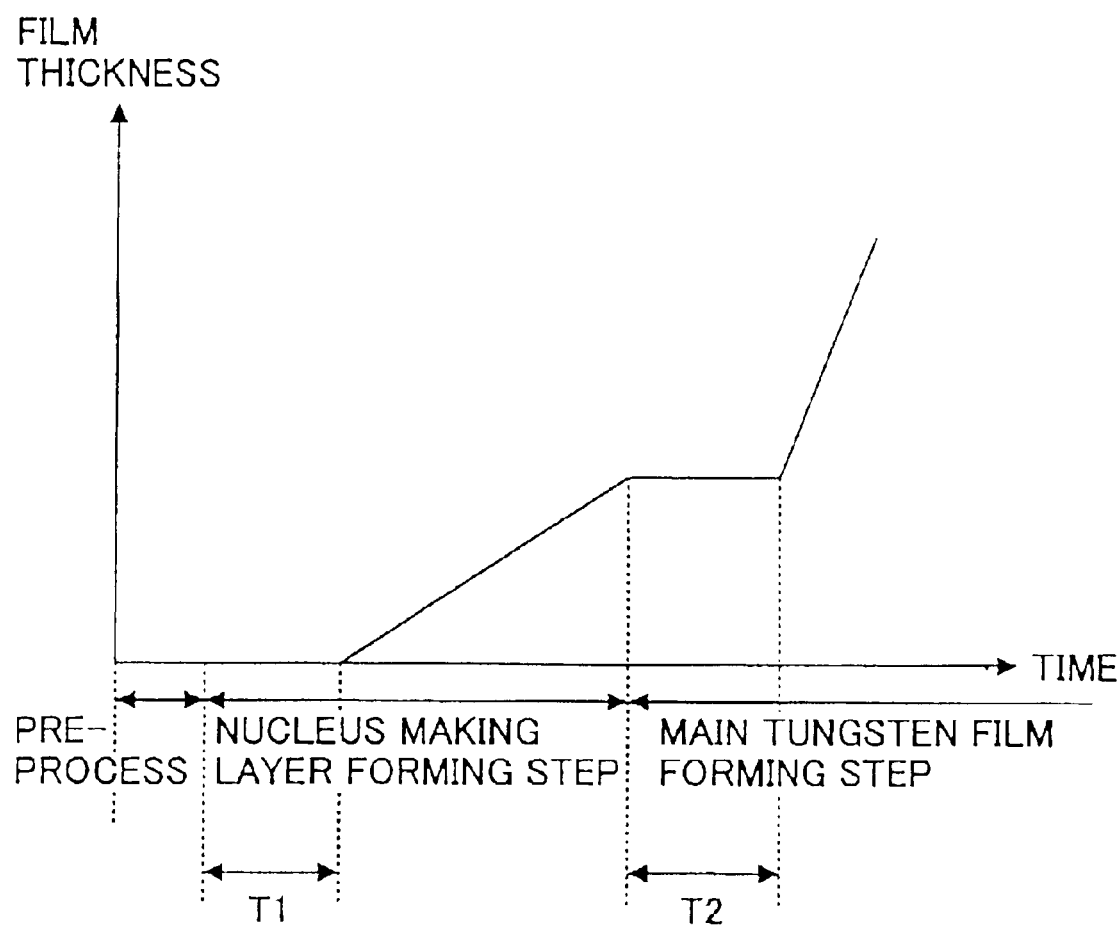
FIG. 1 is a graph showing a relation between a time chart and a film thickness to explain a conventional method of forming a tungsten wiring part.

A description will now be given, with reference to the drawings, of embodiments of the present invention. In respective figures, parts that are the same or the substantially same as the parts shown in other figures are given the same reference numerals.

Figure 4:
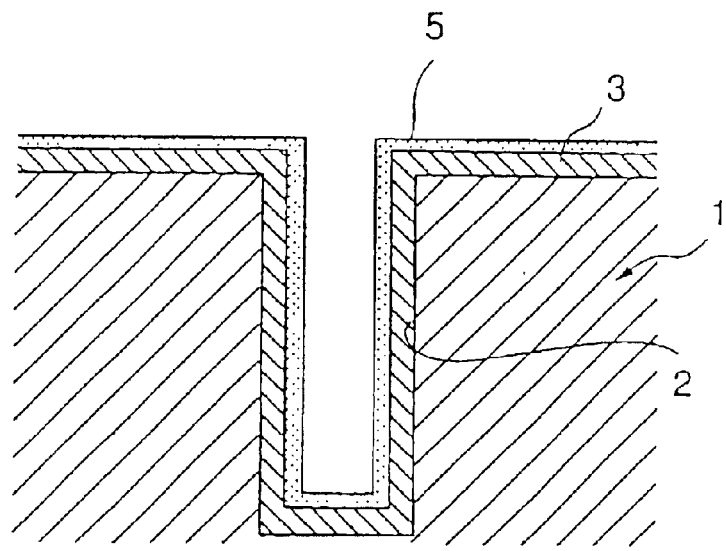
FIG. 4 is a cross-sectional view showing a structure of a via-hole during forming a film, to explain a method of forming a tungsten wiring part according to the present invention.
Figure 5:
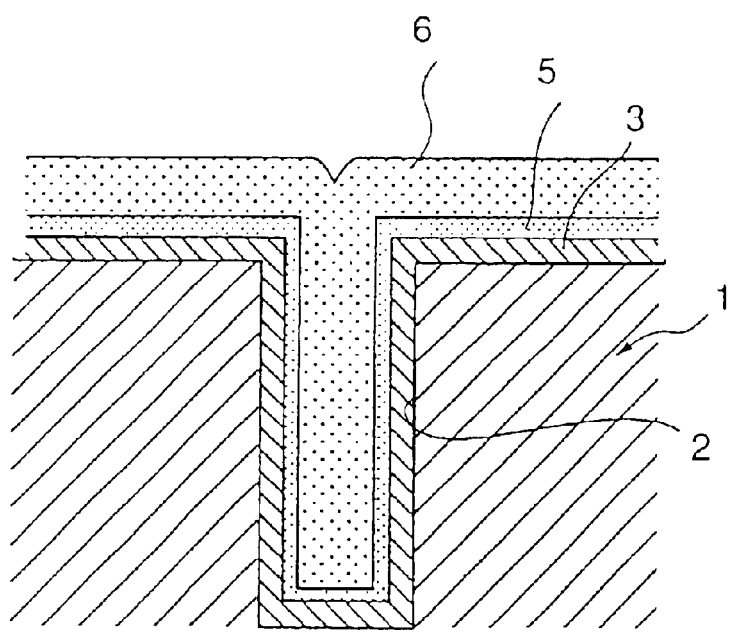
FIG. 5 is a cross-sectional view showing a structure of a via-hole in a following state of the forming a film, to explain a method of forming a tungsten wiring part according to the present invention.

Inventors of the present invention experimented to obtain a method in that a tungsten is embedded into a via-hole 2 satisfactorily by a CVD method, even if a MO-TiN film 3 including impurities, as a base barrier film, is formed inside the via-hole 2. As a result of the experiment, the inventors realized that it was possible to form a tungsten wiring part having a sufficient embedding ability as a whole, in case of that an extremely thin film 5 of the tungsten having a satisfactory covering ability was formed before the tungsten was embedded into the hole by the CVD method as shown in FIG. 4. The inventors also realized that a main tungsten film 6 was formed on the extremely thin film 5 as a nucleus making layer as shown in FIG. 5.

The inventors further realized the tungsten layer having a high covering ability could be achieved by the followings for forming the tungsten extremely thin film 5. Firstly, an ingredient gas such as a $WF_6$ gas, a $SiH_4$ gas or the like, was supplied in sequence. After the ingredient gas which might be reacted each other was supplied in sequence, namely after the $WF_6$ gas or the $SiH_4$ gas was supplied in sequence, vacuum-exhausting the ingredient gas or substituting the ingredient gas by the other gas such as Ar (argon), $N_2$ (nitride), or $H_2$ (hydrogen) was implemented respectively.

That is, a $WF_6$ gas reached a base part of the hole sufficiently. The gas was absorbed on a surface of an object of forming a film. And then, the only absorption layer having an equal thickness decided by the temperature and the pressure was formed by a vacuum-exhaustion or substitution process. After a surplus $WF_6$ gas was removed, the $SiH_4$ gas was supplied, thereby only absorbed $WF_6$ reacted with $SiH_4$ so that a tungsten layer was formed. According to the present invention, the ingredient gas was consumed not only on an upper part of the hole but also at the base part of the hole. Hence, the tungsten layer could have highly satisfactory covering ability.

Figure 6:
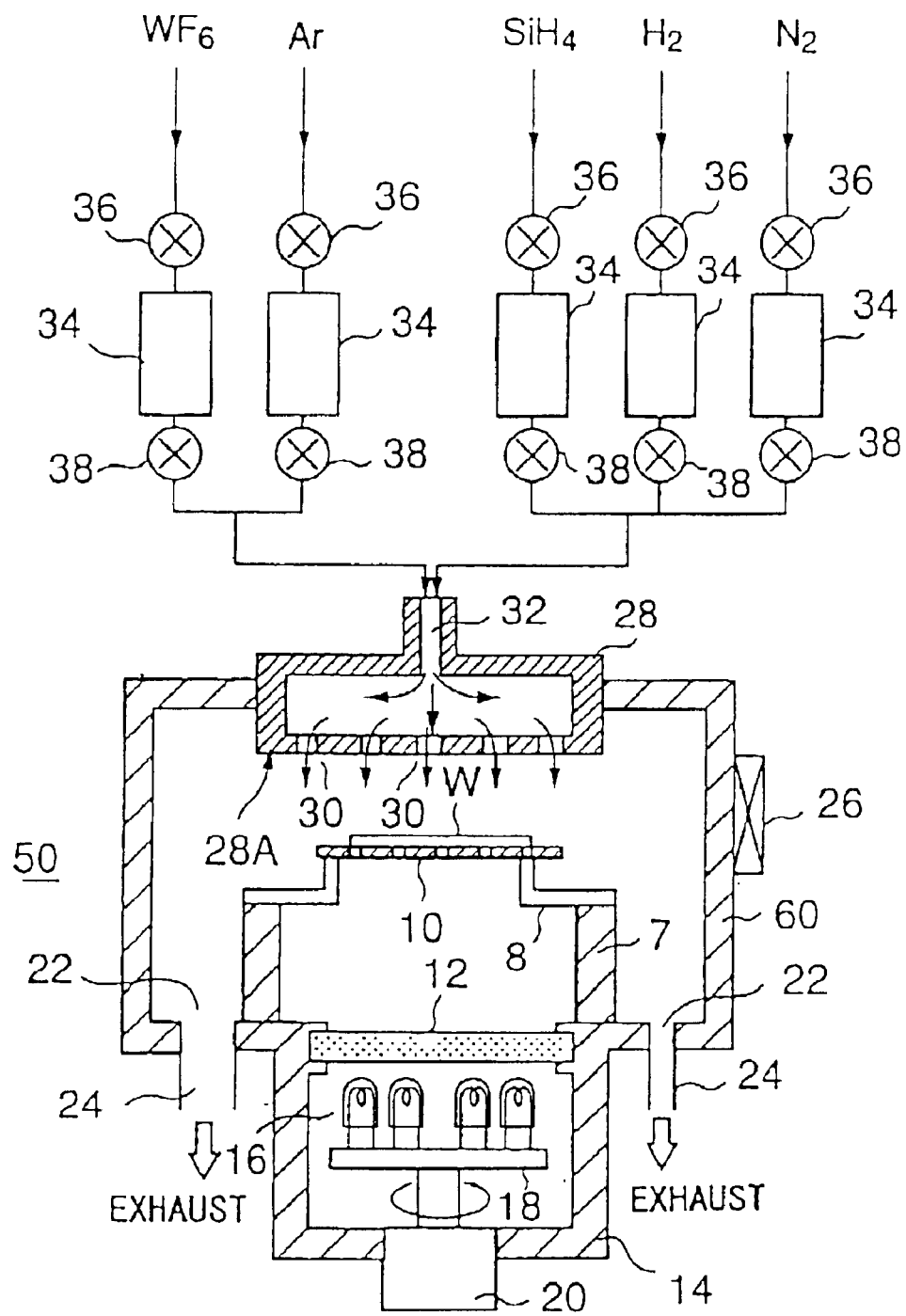
FIG. 6 is a schematic structure view showing a vacuum process apparatus to carry out a method of forming a tungsten wiring part according to the present invention.

FIG. 6 is a schematic structure view showing a vacuum process apparatus to carry out a method of forming a tungsten wiring part according to the present invention. A vacuum process apparatus for carrying out the present invention will be described.

A vacuum process apparatus 50 includes a process vessel 60. The process vessel 60, for example, is made of aluminum and has a cylinder shape. A reflector 7, having a cylinder shape and extending perpendicularly from a base part of the process vessel 60, is provided inside of the process vessel 60. A support member 8 having L shape is mounted on the reflector 7. A load stand 10 for loading a semiconductor wafer W which is an object body of the process is mounted on an upper surface of the support member 8. The load stand 10 is comprised of a high thermal conductive material such as a carbon material, AlN (aluminum nitride) or the like having a thickness of several mm.

A permeation window 12 made of quartz is arranged tightly on the base part of the process vessel 60 which is just under the load stand 10. A heat room 14 having a box shape is arranged, as surrounding the permeation window 12, just under the permeation window 12. The heat room 14 includes a plurality of heating lumps 16 provided on the rotating stand 18 which also serves as a reflection mirror. The rotating stand 18 is rotated by a rotating motor 20. Therefore, heat rays radiated from the heating lumps 16 are irradiated on a bottom surface of the load stand 10 through the permeation window 12. Hence, the wafer W on the load stand 10 is heated indirectly.

An exhaust opening part 22 is provided near the base part of the process vessel. The exhaust opening part 22 is connected with an exhaust passage 24 which is connected with a vacuum pump not shown in FIG. 6. Hence, it is possible to evacuate an inside of the process vessel 60. A gate valve 26 is provided on the side wall of the process vessel 60. The gate valve 26 opens and closes when the wafer is carried out and in the process vessel 60.

A shower head part 28 leading the ingredient gas to the process vessel 60 is provided at a ceiling part of the process vessel which faces to the load stand 10. The shower head part 28 has an injection surface 28A where a large number of gas jetting holes 30 are provided. The shower head part 28 also has a gas leading part 32. The gas leading part 32 is connected with a gas supply system which supplies the necessary ingredient gas for a step of forming a film. Respective gas sources such as sources of $WF_6$, $SiH_4$, Ar, $N_2$, $H_2$, and the like are connected with gas leading part 32.

Laying pipes of the respective gas sources include a mass flow controller 34 as a flow controller and two opening-closing valves 36 and 38. The mass flow controller 34 is put between the two opening-closing valves 36 and 38. Hence, it is possible to select necessity or un-necessity of gas flow control and gas supply. One of or a mixture of the respective gasses having a designated amount is supplied from the gas source to the shower head part 28. After that, the gas is substantially equally supplied from the jet hole 30 into the process vessel 60. Concurrently, it is possible to keep a designated vacuum degree regarding the process vessel 60 by absorbing and exhausting the inside atmosphere of the process vessel 60 at a designated exhaust rate.

Figure 2:
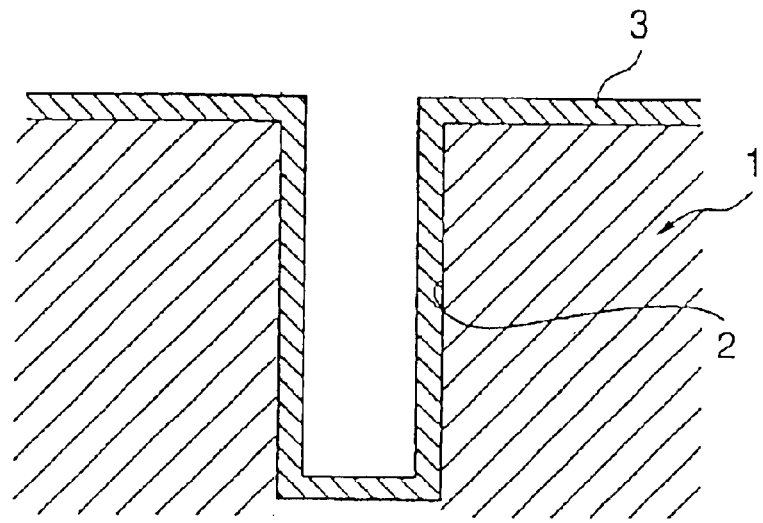
FIG. 2 is a cross-sectional view showing a structure of a via-hole in a prior state to forming a film, to explain a method of forming a tungsten wiring part according to the conventional art and present invention.
Figure 3:
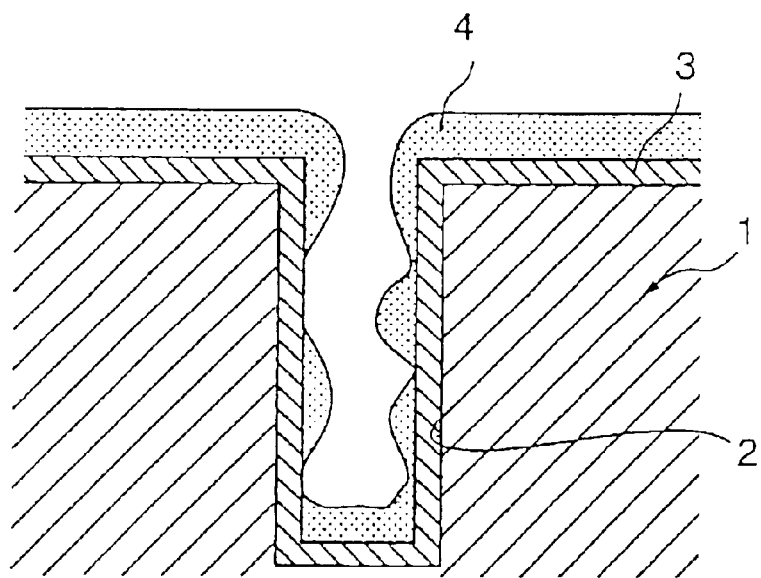
FIG. 3 is a cross-sectional view showing a structure of a via-hole in a following state of the forming a film, to explain a method of forming a tungsten wiring part according to the conventional art.
Figure 7:
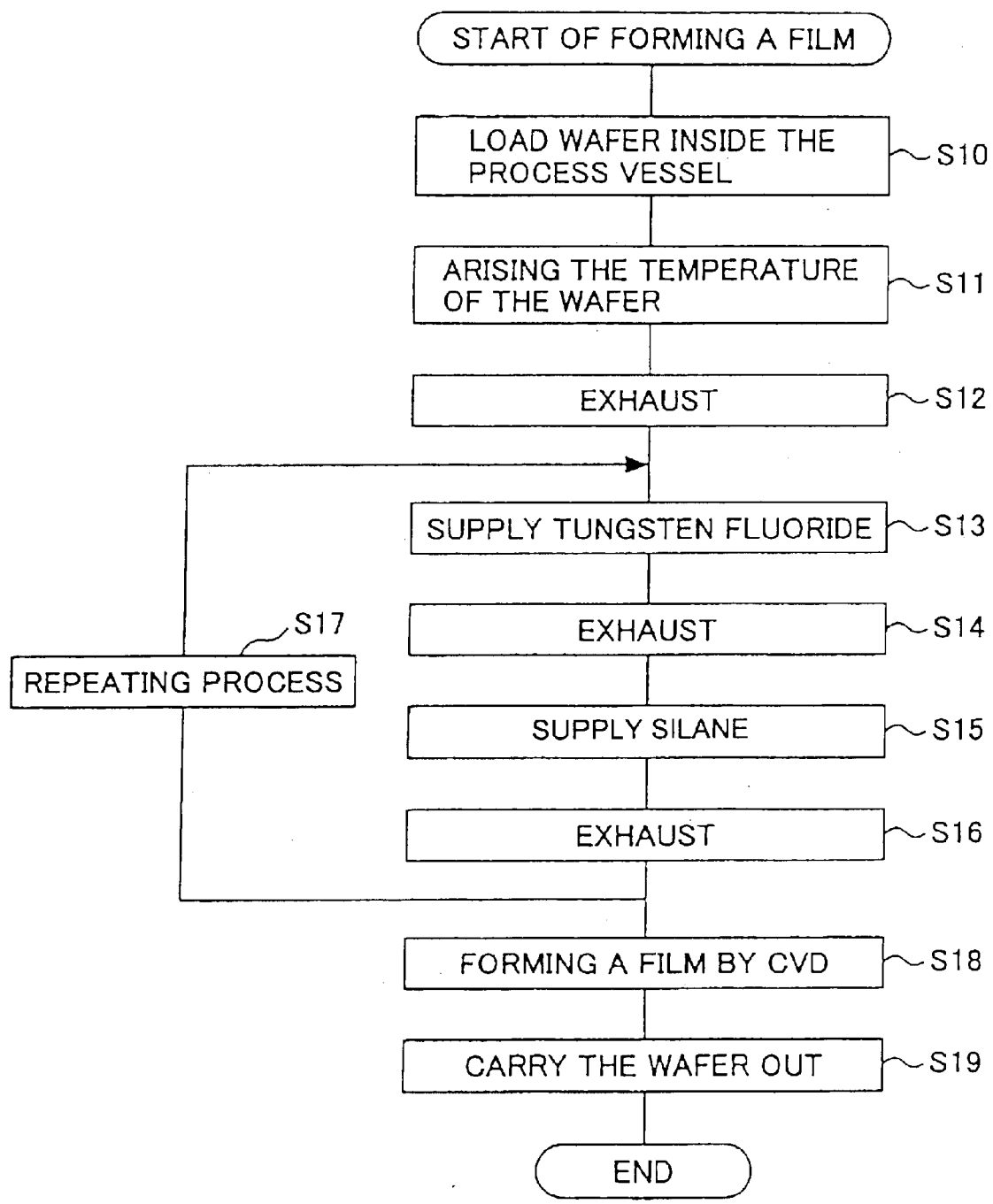
FIG. 7 is a flow-chart to carry out a method of forming a tungsten wiring part according to the present invention.

One embodiment according to the present invention in a state where an apparatus has an above-mentioned structure will be described with FIGS. 2, 4, 5, and 7. FIG. 7 is a flow-chart to carry out a method of forming a tungsten wiring part according to the present invention. FIG. 2 is a cross-sectional view showing a structure of a via-hole in a prior state to forming a film, to explain a method of forming a tungsten wiring part according to the conventional art and present invention. FIG. 4 is a cross-sectional view showing a structure of a via-hole during forming a film, to explain a method of forming a tungsten wiring part according to the present invention. FIG. 5 is a cross-sectional view showing a structure of a via-hole in a following state of the forming a film, to explain a method of forming a tungsten wiring part according to the present invention.

In a step 10, a wafer W is carried into the process vessel 60 by opening a gate valve 26 provided on a side wall of the process vessel 60 and utilizing a carrying arm not shown in FIG. 6. At this time, the heating lump 16 is set in advance as having a designated temperature, for instance as the wafer W has a temperature of 300° C., and the wafer W is loaded on the load stand 10 heated with a designated temperature. A via-hole 2 and a base barrier film 3 made of MO-TiN are formed on a surface of the wafer W in advance, as shown in FIG. 2.

In a step 11 following the step 10, Ar or $N_2$ is supplied from the gas source to the shower head part 28. The process vessel 60 keeps a designated pressure, for instance 400 Pa, and the inside of the process vessel 60 is exhausted. Hence, a heat from the load stand 10 is conducted to the wafer W, thereby the temperature of the wafer W arises.

In a step 12 following the step 11, supplying a gas is stopped. Inside of the process vessel 60 is evacuated until the pressure of the inside of the process vessel 60 becomes for example 10 Pa and under.

In a step 13 following the step 12, a gas formed by mixing the $WF_6$ gas and a little amount of the Ar and $N_2$ gases is supplied to the shower head part 28 and the inside of the vessel 60 is kept at designated pressure and exhausted. Thereby, the $WF_6$ gas is supplied with a conduction of 150 Pa sec on the wafer W substantially equally.

In a step 14 following the step 13, supplying a gas is stopped and the inside of the process vessel 60 is evacuated and exhausted until inside of the process vessel 60 becomes for example 10 Pa and under. During this step, only an absorption layer of the $WF_6$, having an equal thickness based on the temperature and the pressure, is stayed behind on an upper surface, a side surface, and a bottom surface of the via-hole of the wafer W.

In a step 15 following the step 14, a gas formed by mixing the $SiH_4$ gas and a little amount of Ar and $N_2$ gas is supplied to the shower head part 28, and the inside of the process vessel 60 is kept at designated pressure and exhausted.

Thereby, the $SiH_4$ gas is supplied with a conduction of 70 Pa sec on the wafer W substantially equally. During this step, the absorption layer of the $WF_6$ gas stayed behind in step 14 and having a substantially equal thickness is reduced by the $SiH_4$, so that the tungsten film (W film) of a molecule layer level, is formed.

In a step 16 following the step 15, supplying a gas is stopped and the inside of the process vessel 60 is evacuated and exhausted until the inside of the process vessel 60 becomes for example 10 Pa and under.

As shown in a step 17, the steps 13–16 are repeated to carry out designated numbers of cycles such as 17 cycles, until the extremely tungsten thin film 5 having a designated thickness such as 1 nm as shown in FIG. 4 is obtained.

As described above, after the tungsten extremely thin film 5 having a designated thickness is formed, in a step 18, a main tungsten film 6 is formed. The main tungsten film 6 is formed by a normal CVD method as shown in FIG. 5 on the tungsten extremely thin film as a nucleus making layer. After forming the main tungsten film 6 is completed, in a step 19, the gate valve 26 provided on the side wall of the process vessel 60 is opened and then the wafer W is carried out of the process vessel 60 by the carrying arm not shown in FIG. 6.

According to an operation, as a result of the experiment by inventors, by a scanning electron microscope about the cross section of the wafer W in which step 19 is completed, sufficient embedding into the via-hole having a diameter of 0.2 μm and a depth of 1.0 μm could be achieved without any defects.

The above embodiment, for forming the tungsten extremely thin film 5, shows an example of evacuating and exhausting at an interval of supplying $WF_6$ and $SiH_4$. After supplying the $WF_6$ or $SiH_4$ gas is stopped, purge may be implemented. In the purge, a large amount, such as 200 sc cm and more, of the flow of an inert gas, such as Ar or $N_2$ or $H_2$, is supplied, thereby the $WF_6$ or $SiH_4$ gas in the process vessel 60 is pushed out.

For instance, according to the experiment by inventors, the purge was implemented by the following steps in a state where the process vessel 60 had an inside pressure of 1000 Pa and the wafer had a temperature of 350° C. That is, in a step 13, the $WF_6$ gas was supplied with a conduction of 38 Pa sec; the Ar gas was supplied with a conduction of 3816 Pa sec; and the $N_2$ gas was supplied with a conduction of 1145 Pa sec. Next, in a step 14, the Ar gas was supplied with a conduction of 2308 Pa sec; and the $N_2$ gas was supplied with a conduction of 692 Pa sec. Furthermore, in a step 15, the $SiH_4$ gas was supplied with a conduction of 112 Pa; the Ar gas was supplied with a conduction of 3759 Pa sec; and the $N_2$ gas was supplied with a conduction of 1127 Pa sec. Next, in a step 16, the Ar gas was supplied with a conduction of 2308 Pa see; and the $N_2$ gas was supplied with a conduction of 692 Pa sec. In a step 17, steps 13–16 were repeated to carry out 6 cycles, thereby an extremely tungsten thin film having 7.0 nm was obtained.

It is effective to supply $H_2$ when the tungsten extremely thin film should not be oxidized. In case of that the "vacuum-exhaustion—purge—vacuum-exhaustion" is utilized as one set, although a whole of a time for forming a film becomes long, there is an advantage in that a residual gas of the $WF_6$ or $SiH_4$ gas can be removed greatly.

In this embodiment, in case of that the tungsten extremely thin film 5 is formed, firstly $WF_6$ is supplied without implementing a pre-process, after the wafer W is loaded in the process vessel 60. The pre-process shown in FIG. 1 may be implemented after the wafer W is loaded in the process vessel 60 and before the tungsten extremely thin film 5 is formed.

As the pre-process, for instance, the $SiH_4$ gas may be flown on the surface of the wafer. For instance, the incubation time T1 at the time of that the tungsten extremely thin film 5 is formed can be reduced by supplying the $SiH_4$ gas with a conduction of 7000 Pa sec. According to the above-mentioned embodiment which does not include the pre-process, a cycle of supplying the $WF_6$ gas and the $SiH_4$ gas is repeated seventeen times for forming 1 nm of a thickness of the tungsten extremely thin film 5. Thirteen cycles in the seventeen cycles correspond to the incubation time T1 and no film of the tungsten extremely thin film 5 is formed therein. Forming a film starts from the fourteenth cycle and 1 nm of a thickness of the tungsten extremely thin film is formed for four cycles until the seventeenth cycle is completed.

On the other hand, in the pre-process, by supplying the $SiH_4$ gas with a conduction of 7000 Pa sec, number of cycles corresponding to the incubation time T1 is reduced from thirteen to three. Thus, forming a film starts from fourth cycle, so that the total cycles of supplying the $WF_6$ and the $SiH_4$ for forming the tungsten extremely thin film having 1 nm of the film thickness is reduced to seven cycles. Thus, it is preferable to do pre-process because a whole of time for forming a film is greatly reduced.

In case of that the $SiH_4$ gas flow is supplied with a conduction of 1 kPa sec and more, the incubation time is reduced. If the $SiH_4$ gas is supplied with a conduction more than 25 kPa sec, a through-put is reduced because the process time becomes long and a particle occurs because the pressure of $SiH_4$ becomes high. Therefore, the $SiH_4$ gas flow may be preferable to be supplied with a conduction of 25 kPa sec and less.

As a requirement for forming the tungsten thin film, 300° C. of the temperature of the wafer, supplying the $WF_6$ with a conduction of 150 Pa sec, supplying the $SiH_4$ gas with a conduction of 70 Pa sec, and 0.25 nm of amount of forming a film in one cycle, are shown in the above embodiment. Inventors, however, realized the following relation shown in FIGS. 8, 9, and 10 after considering the method of the forming of the tungsten extremely thin film variously.

Figure 8:
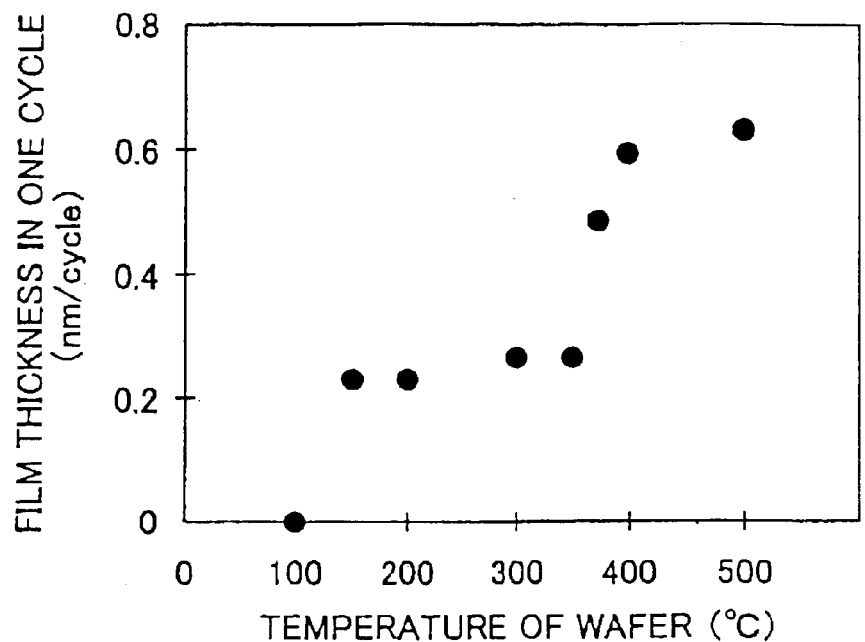
FIG. 8 is a graph showing a relation between a film thickness and a wafer temperature in one cycle regarding a tungsten extremely thin film which is a nucleus making layer, in a method of forming a tungsten wiring part according to the present invention.

FIG. 8 is a view showing a relation of the temperature of the wafer and the film thickness in one cycle. In case of that the wafer has a temperature in a range between 150° C. and 350° C., the film has a substantially constant thickness in a range between 0.23 nm to 0.28 nm in one cycle regardless of the wafer temperature, under some conditions. In case of that the wafer has a temperature in a range between 380° C. and 500° C., the film has a substantially constant thickness in a range between 0.55 nm to 0.6 nm in one cycle regardless of the wafer temperature under some conditions.

In these ranges, a reaction improves as a rate-determining step of the absorption of the ingredient. In these ranges, the tungsten extremely thin film having a satisfactory control ability and covering ability can be achieved.

According to an experiment implemented by inventors, it was found that if the wafer has a temperature of a range of between 355° C. and 500° C., the tungsten extremely thin film having a satisfactory control ability and covering ability can be achieved as well as the wafer has a temperature of a range of between 380° C. and 500° C.

Figure 9:
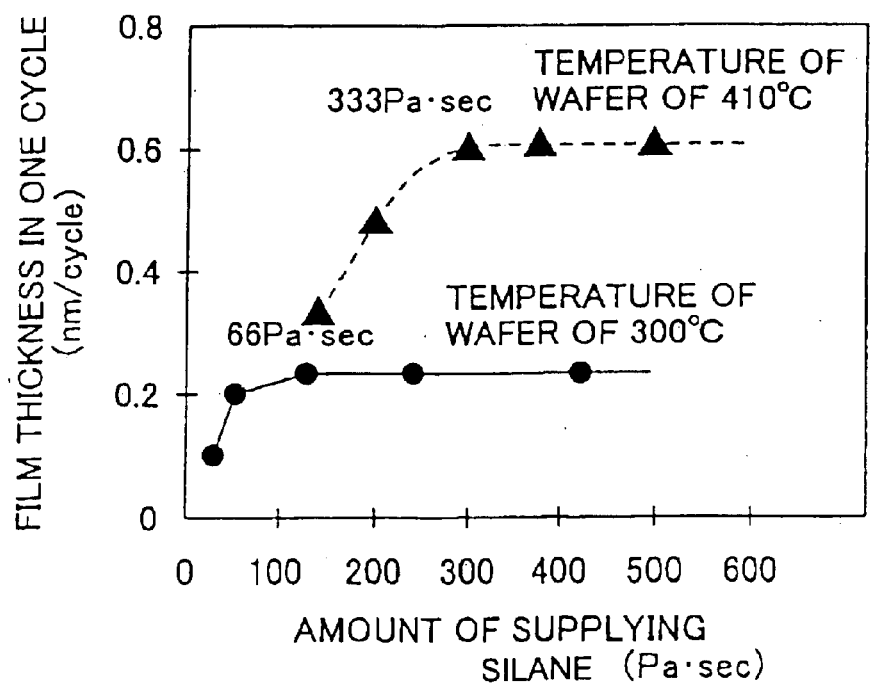
FIG. 9 is a graph showing a relation between a film thickness and amount of supplying $SiH_4$ in one cycle regarding a tungsten extremely thin film which is a nucleus making layer, in a method of forming a tungsten wiring part according to the present invention.

FIG. 9 is a view showing a relation of the amount of supplying the $SiH_4$ and the film thickness in one cycle. A result of the experiment, in which 300° C. of the wafer temperature is a representative of a range between 150° C. and 350° C. of the wafer temperature and 410° C. of the wafer temperature is a representative of a range between 380° C. and 500° C. of the wafer temperature, is shown in FIG. 9.

According to FIG. 9, in case of the wafer has a temperature in a range between 150° C. and 350° C., the thin film thickness in one cycle is saturated when the $SiH_4$ is supplied with a conduction of 66 Pa sec and more. Also, in case of the wafer has a temperature in a range between 380° C. and 500° C., the film thickness in one cycle is saturated when the $SiH_4$ is supplied with a conduction of 333 Pa sec and more. In these saturated ranges, reactions improve as a rate-determining step of the absorption of the ingredient. In these ranges, the tungsten extremely thin film having a satisfactory control ability and covering ability can be achieved.

According to an experiment implemented by inventors, it was found that if the $SiH_4$ is supplied with a conduction of 13 Pa sec and more in case of the wafer has a temperature in a range between 150° C. and 350° C., and the $SiH_4$ is supplied with a conduction of 40 Pa sec and more in case of the wafer has a temperature in a range between 380° C. and 500° C., the control tungsten extremely thin film having a satisfactory control ability and covering ability can be achieved.

Figure 10:
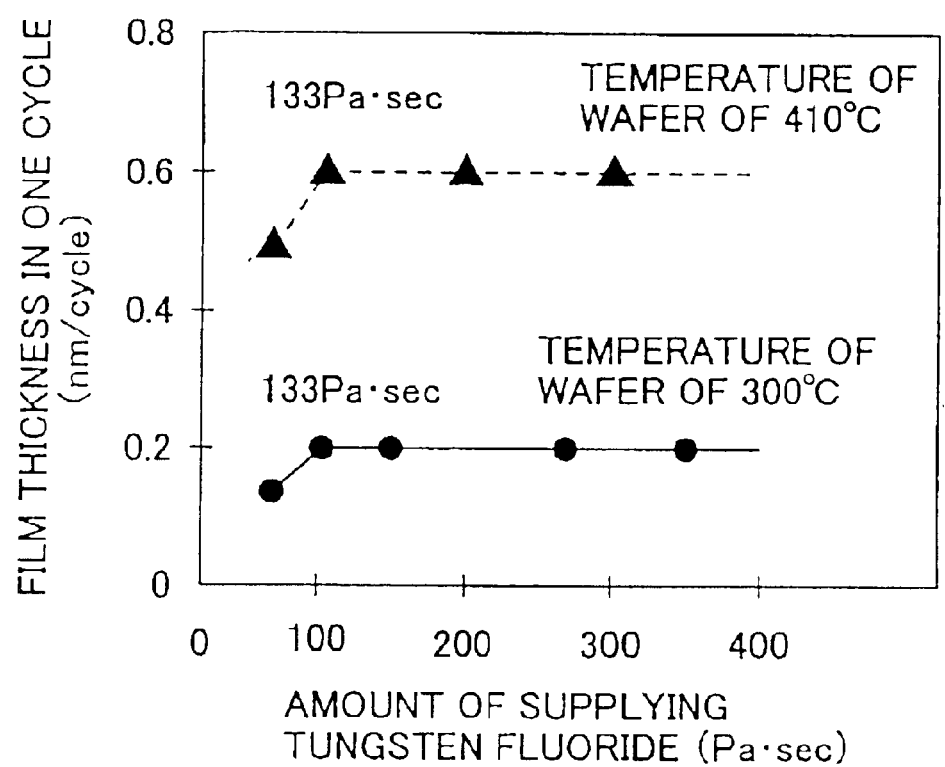
FIG. 10 is a graph showing a relation between a film thickness and amount of supplying $WF_6$ in one cycle regarding a tungsten extremely thin film which is a nucleus making layer, in a method of forming a tungsten wiring part according to the present invention.

FIG. 10 is a view showing a relation of the temperature of the wafer and the film thickness of $WF_6$ in one cycle. A result of the experiment, in which 300° C. of the wafer temperature is a representative of a range between 150° C. and 350° C. of the wafer temperature and 410° C. of the wafer temperature is a representative of a range between 380° C. and 500° C. of the wafer temperature, is shown in FIG. 10.

In these saturated ranges, the film thickness in one cycle is saturated and reactions improve as a rate-determining step of the absorption of the ingredient in case of that $WF_6$ is supplied with a conduction of 133 Pa sec and more. In these ranges, the tungsten extremely thin film having a satisfactory control ability and covering ability can be achieved.

According to an experiment implemented by inventors, it was found that if the $WF_6$ is supplied with a conduction of 5 Pa sec and more, the tungsten extremely thin film having a satisfactory control ability and covering ability can be achieved as well as the $WF_6$ is supplied with a conduction of 133 Pa sec and more.

If the $SiH_4$ and $WF_6$ are supplied with a conduction more than 10 kPa sec, it takes too much time for one cycle, so that a throughput is reduced. Besides, in this case, since the $SiH_4$ and $WF_6$ are supplied too much, $SiH_4$ and $WF_6$ may likely to be stayed so that it is difficult to substitute the gases. Hence, it is preferable that upper limits of the supplying $SiH_4$ and $WF_6$ be respectively at a conduction of 10 kPa sec or less.

The present invention does not limit the case of that the tungsten extremely thin film has 1 nm of the film thickness as mentioned above. Rather, it is preferable that the film has a thickness in a range between 0.2 nm and 20.0 nm. The film having a thickness of less than 0.2 nm is not preferable because the film thickness is too thin partially and the film may not serve as the nucleus making layer. The film having a thickness of more than 20.0 nm has no problem in terms of a function of the nucleus making layer. However, the film having a thickness of more than 20.0 nm is not preferable because the time for forming a whole of a film is increased so that the through put is reduced. On the other hand, if the film has a thickness in a range between 0.2 nm and 20.0 nm, it serves as the nucleus making layer efficiently and through put is not largely reduced.

The above embodiment shows an example of forming the tungsten wiring part in the via-hole 2. However, the present invention is not limited to a state where the wiring material is tungsten, but various variations and modifications such as using other materials may be made without departing from the scope of the present invention.

This patent application is based on Japanese priority patent application No. 2000-351716 filed on Nov. 17, 2000, the entire contents of which are hereby incorporated by reference.

What is claimed is:

1. A method of forming a film on an object to be processed and held in a processing vessel, comprising:
   heating said object in said processing vessel while introducing an inert gas into said processing vessel;
   interrupting supplying of said inert gas and evacuating said processing vessel to a vacuum state;
   supplying a first source gas into said processing vessel so as to expose said object to said first source gas such that adsorption of said first source gas to said object occurs under a saturating condition in which an adsorption rate of said first source gas to said object is saturated;
   interrupting supplying of said first source gas to said processing vessel and evacuating said processing vessel to a vacuum state;
   supplying a second source gas into said processing vessel so as to expose said object, on which said first source gas is adsorbed, to said second source gas such that adsorption of said second source gas to said object occurs under a saturating condition in which an adsorption rate of said second source gas to said object is saturated;
   interrupting supplying of said second source gas and evacuating said processing vessel to a vacuum state;
   causing a reaction between said first source gas and said second source gas adsorbed on said object to form a film; and
   repeating said supplying said first source gas, interrupting said supplying of said first source gas, evacuating said processing vessel to a vacuum state, supplying said second source gas, interrupting supplying of said second source gas, and evacuating said processing vessel to a vacuum state a plurality of times to form said film.

2. The method as claimed in claim 1, further comprising:
   removing a residual gas from said processing vessel by one of a vacuum evacuation process and by introducing an inert gas after interrupting supplying of said first source gas and before supplying said second source gas.

3. The method as claimed in claim 1, wherein said first source gas comprises a gas containing a metal and wherein said second source gas comprises a reducing gas.

4. The method as claimed in claim 3, wherein said gas containing said metal and said reducing gas are supplied together with an inert carrier gas.

5. The method as claimed in claim 1, wherein said first source gas is supplied by controlling a product of a partial pressure of said first source gas and a duration of supply of said first source gas, and wherein said second source gas is supplied by controlling a product of a partial pressure of said second source gas and a duration of supply of said second source gas.

6. The method as claimed in claim 1, wherein said film is formed with a thickness greater than or equal to 0.23 nm in each cycle.

7. A method of forming a film on an object to be processed and held in a processing vessel, comprising:
heating said object in said processing vessel while introducing an inert gas into said processing vessel;
interrupting supplying of said inert gas and evacuating said processing vessel to a vacuum state;
supplying a first source gas into said processing vessel so as to expose said object to said first source gas such that adsorption of said first source gas to said object occurs under a saturating condition in which an adsorption rate of said first source gas to said object is saturated;
interrupting supplying of said first source gas and evacuating said processing vessel to a vacuum state;
supplying a second source gas into said processing vessel so as to expose said object, on which said first source gas is adsorbed, to said second source gas such that adsorption of said second source gas to said object occurs under a saturating condition in which an adsorption rate of said second source gas to said object is saturated;
interrupting supplying of said second source gas and evacuating said processing vessel to a vacuum state;
causing a reaction between said first source gas and said second source gas adsorbed on said object to form a first film;
repeating said supplying said first source gas, interrupting said supplying of said first source gas, evacuating said processing vessel to a vacuum, supplying said second source gas, interrupting supplying of said second source of gas, and evacuating said processing vessel to a vacuum state a plurality of times to form a second film; and
forming a third film on said second film by supplying a gas including said first source gas to said processing vessel.

8. The method as claimed in claim 7, further comprising:
removing a residual gas from said processing vessel by one of a vacuum evacuation process or by introducing an inert gas after interrupting supplying of said first source gas and before starting supplying said second source gas.

9. The method as claimed in claim 7, wherein said first source gas comprises a gas containing a metal and wherein said second source gas comprises a reducing gas.

10. The method as claimed in claim 9, wherein said gas containing said metal and said reducing gas are supplied together with an inert gas.

11. The method as claimed in claim 7, wherein said first source gas is supplied by controlling a product of a partial pressure of said first source gas and a duration of supply of said first source gas, and wherein said second source gas is supplied by controlling a product of a partial pressure of said second source gas and a duration of supply of said second source gas.

12. The method as claimed in claim 7, wherein said first film functions as a nucleation layer.

13. A method of forming a film on an object to be processed and held in a processing vessel, comprising:
supplying a first source gas into said processing vessel so as to expose said object to said first source gas while controlling a product of a partial pressure of said first source gas and a duration in which said object is exposed to said first source gas, such that adsorption of said first source gas to said object occurs under a saturating condition in which an adsorption rate of said first source gas to said object is saturated;
interrupting supplying of said first source gas to said processing vessel and supplying a second source gas into said processing vessel so as to expose said object, on which said first source gas is adsorbed, to said second source gas while controlling a product of a partial pressure of said second source gas and a duration in which said object is exposed to said second source gas, such that adsorption of said second source gas to said object occurs under a saturating condition in which an adsorption rate of said second source gas to said object is saturated;
causing a reaction between said first source gas and said second source gas adsorbed on said object to form a film; and
repeating a plurality of times said supplying said first source gas, interrupting said supplying of said first source gas, supplying said second source gas and causing the reaction between said first source gas and said second source gas.

14. The method as claimed in claim 13, further comprising:
removing a residual gas from said processing vessel by one of a vacuum evacuation process and by introducing an inert gas after interrupting supplying of said first source gas and before starting supplying said second source gas.

15. The method as claimed in claim 13, wherein said first source gas comprises a gas containing a metal and wherein said second source gas comprises a reducing gas.

16. The method as claimed in claim 15, wherein said gas containing said metal and said reducing gas are supplied together with an inert gas.

17. A method of fanning a film on an object to be processed and held in a processing vessel, comprising the steps of:
supplying a first source gas into said processing vessel so as to expose said object to said first source gas while controlling a product of a partial pressure of said first source gas and a duration in which said object is exposed to said first source gas, such that adsorption of said first source gas to said object occurs under a saturating condition in which an adsorption rate of said first source gas to said object is saturated;
interrupting supplying of said first source gas to said processing vessel and supplying a second source gas into said processing vessel so as to expose said object, on which said first source gas is adsorbed, to said second source gas while controlling a product of a partial pressure of said second source gas and a duration in which said object is exposed to said second source gas, such adsorption of said second source gas to said object occurs under a saturating condition in an adsorption rate of said second source gas to said object is saturated;
causing a reaction between said first source gas and said second source gas adsorbed on said object to form a first film;
repeating a plurality of times said supplying said first source gas, interrupting said supplying of said first source gas, supplying said second source gas and causing the reaction between said first source gas and said second source gas, to form a second film on said object as a nucleation layer; and
forming a third film on said second film by supplying a gas including said first source gas to said processing vessel.

18. The method as claimed in claim 17, further comprising:
removing a residual gas from said processing vessel by one of a vacuum evacuation process or by introducing an inert gas after interrupting supplying of said first source gas and before starting supplying said second source gas.

19. The method as claimed in claim 17, wherein said first source gas comprises a gas containing a metal and wherein said second source gas comprises a reducing gas.

20. The method as claimed in claim 19, wherein said gas containing said metal and said reducing gas are supplied together with an inert carrier gas.

21. A method for forming a film on an object to be processed and held in a processing vessel, comprising:
supplying a $WF_6$ gas into said processing vessel so as to expose said object to said $WF_6$ gas while controlling a product of a partial pressure of said $WF_6$ gas and a duration in which said object is exposed to said $WF_6$, such that adsorption of said $WF_6$ gas to said object occurs under a saturating condition in which an adsorption rate of said $WF_6$ gas to said object is saturated;
interrupting supplying of said $WF_6$ gas to said processing vessel and evacuating said $WF_6$ gas from said processing vessel;
supplying a $SiH_4$ gas into said processing vessel so as to expose said object, on which said $WF_6$ gas is adsorbed, to said $SiH_4$ gas while controlling a product of partial pressure of said $SiH_4$ gas and a duration in which said object is exposed to said $SiH_4$ gas, such that adsorption of said $SiH_4$ gas to said object occurs under a saturating condition in which an adsorption rate of said $SiH_4$ gas to said object is saturated;
interrupting supplying of said $SiH_4$ gas to said processing vessel and evacuating said $SiH_4$ gas from said processing vessel;
causing a reaction between said $WF_6$ gas and said $SiH_4$ gas adsorbed on said object to form a first W film;
repeating a plurality of times said supplying said $WF_6$ gas, interrupting said supplying of said $WF_6$ gas and evacuating said $WF_6$ gas from said processing vessel, supplying said $SiH_4$ gas, interrupting supplying of said $SiH_4$ gas to said processing vessel and evacuating said $SiH_4$ gas from said processing vessel and causing the reaction between the $WF_6$ and the $SiH_4$ gas to form a second W film on said object as a W nucleation layer; and
forming a metal layer of W on said W nucleation layer by supplying a gas containing $WF_6$ and $H_2$ to said processing vessel.

22. The method as claimed in claim 21, further comprising:
forming a TiN film underneath said W nucleation layer by an organic Ti compound.

23. The method as claimed in claim 21, wherein said W nucleation layer has a thickness ranging between 0.2 nm and 20.0 nm.

24. The method as claimed in claim 21, wherein said $WF_6$ gas is supplied by setting said product of said partial pressure of said $WF_6$ gas and said duration in which said object is exposed to said $WF_6$ gas in a range between 133 Pa.sec and 10 kPa.sec.

25. The method as claimed in claim 24, wherein said $SiH_4$ gas is supplied by setting said product of said partial pressure of said $SiH_4$ gas and said duration in which said object is exposed to said $SiH_4$ gas in a range between 66 Pa.sec and 10 kPa.sec.

26. The method as claimed in claim 21, further comprising:
prior to said supplying said $WF_6$ gas into said processing vessel, preprocessing said object by exposing said object to said $SiH_4$ gas.

27. The method as claimed in claim 26, wherein in said preprocessing of said object, said $SiH_4$ gas is supplied by setting said product of said partial pressure of said $SiH_4$ gas and said duration in which said object is exposed to said $SiH_4$ gas in a range between 6 kPa.sec and 25 kPa.sec.

28. The method as claimed in claim 21, wherein said supplying said $WF_6$ gas into said processing vessel, interrupting supplying of said $WF_6$ gas to said processing vessel and evacuating said $WF_6$ gas from said processing vessel, supplying said $SiH_4$ gas into said processing vessel, interrupting supplying of said $SiH_4$ gas to said processing vessel and evacuating said $SiH_4$ gas from said processing vessel, causing the reaction between said $WF_6$ gas and said $SiH_4$ gas adsorbed on said object, repeating a plurality of times said supplying the $WF_6$ gas, interrupting said supplying of said $WF_6$ gas and evacuating said $WF_6$ gas from said processing vessel, supplying said $SiH_4$ gas, interrupting supplying of said $SiH_4$ gas to said processing vessel and evacuating said $SiH_4$ gas from said processing vessel and causing the reaction between said $WF_6$ gas and said $SiH_4$ gas to form a second W film on said object as a W nucleation layer, are conducted at a temperature in a range between 150° C. and 500° C.

29. The method as claimed in claim 28, wherein said supplying said $WF_6$ gas into said processing vessel, interrupting supplying of said $WF_6$ gas to said processing vessel and evacuating said $WF_6$ gas from said processing vessel, supplying said $SiH_4$ gas into said processing vessel, interrupting supplying of said $SiH_4$ gas to said processing vessel and evacuating said $SiH_4$ gas from said processing vessel, causing the reaction between said $WF_6$ gas and said $SiH_4$ gas adsorbed on said object, are conducted at a substrate temperature in a range between 150° C. and 350° C.

30. The method as claimed in claim 29, wherein said $SiH_4$ gas is supplied by setting said product of said partial pressure of said $SiH_4$ gas and said duration in which said object is exposed to said $SiH_4$ gas in a range between 66 Pa.sec and 10 kPa.sec.

31. The method as claimed in claim 30, wherein said $WF_6$ gas is supplied by setting said product of said partial pressure of said $SiH_4$ gas and said duration in which said object is exposed to said $WF_6$ gas in a range between 133 Pa and 10 kPa.

32. The method as claimed in claim 28, wherein said supplying said $WF_6$ gas into said processing vessel, interrupting supplying of said $WF_6$ gas to said processing vessel and evacuating said $WF_6$ gas from said processing vessel, supplying the $SiH_4$ gas into said processing vessel, interrupting supplying of said $SiH_4$ gas to said processing vessel and evacuating said $SiH_4$ gas from said processing vessel, causing the reaction between said $WF_6$ gas and said $SiH_4$ gas adsorbed on said object, repeating a plurality of times said supplying said $WF_6$ gas, interrupting said supplying of said $WF_6$ gas and evacuating said $WF_6$ gas from said processing vessel, supplying said $SiH_4$ gas, interrupting supplying of said $SiH_4$ gas to said processing vessel and evacuating said $SiH_4$ gas from said processing vessel and causing the reaction between said $WF_6$ gas and said $SiH_4$ gas to form a second W film on said object as a W nucleation layer, are conducted at a substrate temperature in a range between 380° C. and 500° C.

33. The method as claimed in claim 32, wherein said $SiH_4$ gas is supplied by setting said product of said partial pressure of said SiH$_4$ gas and said duration in which said object is exposed to said SiH$_4$ gas to the range between 333 Pa.sec and 10 kPa.sec.

34. The method as claimed in claim 33, wherein said WF$_6$ gas is supplied by setting said product of said partial pressure of said WF$_6$ gas and said duration in which said object is exposed to said WF$_6$ gas in a range between 1333 Pa and 10 kPa.

* * * * *